United States Patent
Zhang et al.

(10) Patent No.: US 10,783,772 B2
(45) Date of Patent: Sep. 22, 2020

(54) WIRELESS SWITCH WITH THREE-WAY CONTROL

(71) Applicant: Eaton Intelligent Power Limited, Dublin (IE)

(72) Inventors: Haidong Zhang, Shanghai (CN); Lin Yang, Jiangsu (CN); Lili Du, Shanghai (CN); Tao Xiong, Shanghai (CN); Shifang Zhang, Shanghai (CN); Ahmed El-Gayyar, Peachtree City, GA (US)

(73) Assignee: Eaton Intelligent Power Limited, Dublin (IE)

( * ) Notice: Subject to any disclaimer, the term of this patent is extended or adjusted under 35 U.S.C. 154(b) by 303 days.

(21) Appl. No.: 16/008,123

(22) Filed: Jun. 14, 2018

(65) Prior Publication Data
US 2019/0385440 A1     Dec. 19, 2019

(51) Int. Cl.
*G08C 17/02*   (2006.01)
*H02M 1/08*    (2006.01)
*H03K 17/56*   (2006.01)
*H02M 7/04*    (2006.01)

(52) U.S. Cl.
CPC ............. *G08C 17/02* (2013.01); *H02M 1/08* (2013.01); *H03K 17/56* (2013.01); *H02M 7/04* (2013.01)

(58) Field of Classification Search
CPC ............ G08C 17/02; H02M 1/08; H02M 7/04
USPC ........................................................ 307/112
See application file for complete search history.

(56) References Cited

U.S. PATENT DOCUMENTS

| | | | | |
|---|---|---|---|---|
| 5,424,709 A | * | 6/1995 | Tal | G05B 19/054 375/259 |
| 6,593,538 B2 | * | 7/2003 | Perret | H01H 33/143 218/3 |
| 7,190,936 B1 | * | 3/2007 | Teo | H03G 3/004 455/127.1 |
| 9,026,648 B1 | | 5/2015 | Slavin | |
| 9,413,171 B2 | * | 8/2016 | Neyhart | H04L 12/2807 |
| 9,847,912 B1 | | 12/2017 | Hutz et al. | |
| 9,860,965 B2 | | 1/2018 | Recker et al. | |
| 9,881,493 B2 | | 1/2018 | Kim et al. | |

(Continued)

OTHER PUBLICATIONS

Automated 3-way Switches: What should my wiring look like? (US version)—wiki—SmartThings Community, downloaded from internet Feb. 24, 2018, https://community.smartthings.com/t/automated-3-way-switches-what-should-my-wiring-look-like-us-version/19075.

*Primary Examiner* — Alfonso Perez Borroto
(74) *Attorney, Agent, or Firm* — Fox Rothschild LLP

(57) ABSTRACT

A system for delivering power to a load includes a master control unit (MCU) communicatively connected to a wireless network. A remote control circuit is electrically connected to the MCU. The remote control unit delivers a signal of a first voltage to the MCU when the remote control unit is not receiving a command signal from a remote controller, and deliver a signal of a second voltage to the MCU when the remote control unit is receiving a command signal from the remote controller. A relay unit is electrically connected to the load and to an output of the MCU. The MCU is programmed to selectively power the load by selectively passing control signals to the relay unit in response to commands received from the wireless network. When no signals are received from the wireless network, the remote control circuit may control the load, either directly or via the MCU.

20 Claims, 7 Drawing Sheets

(56) References Cited

U.S. PATENT DOCUMENTS

| | | | | |
|---|---|---|---|---|
| 10,141,739 B1* | 11/2018 | Davis | ......................... | H02J 1/08 |
| 10,164,541 B2* | 12/2018 | Onodera | ................ | H02M 1/32 |
| 10,564,226 B2* | 2/2020 | Katrak | ................... | G01R 31/40 |
| 2005/0275983 A1* | 12/2005 | Franklin | ........... | H01M 8/04559 |
| | | | | 361/56 |
| 2013/0038318 A1 | 2/2013 | Inukai | | |
| 2014/0009270 A1* | 1/2014 | Yamazaki | ............... | G08C 19/00 |
| | | | | 340/12.22 |
| 2014/0175875 A1* | 6/2014 | Newman, Jr. | ........... | H04L 12/66 |
| | | | | 307/18 |
| 2015/0143150 A1* | 5/2015 | Verdun | ................. | G06F 1/3203 |
| | | | | 713/323 |
| 2016/0107589 A1 | 4/2016 | Proebstle et al. | | |
| 2016/0322831 A1* | 11/2016 | Gilbert | ................... | G01D 11/00 |
| 2017/0019098 A1* | 1/2017 | Kang | ..................... | H02M 1/08 |
| 2017/0027079 A1* | 1/2017 | Dombrowski | ............ | H02J 5/00 |
| 2017/0045249 A1* | 2/2017 | Lee | ........................ | H02K 11/33 |
| 2017/0068267 A1 | 3/2017 | El-Gayyar | | |
| 2017/0069449 A1* | 3/2017 | El-Gayyar | ............... | H04W 4/80 |
| 2017/0271904 A1* | 9/2017 | Ziv | ........................... | H02J 3/00 |
| 2018/0052008 A1* | 2/2018 | Maman | .................... | G06K 9/46 |
| 2018/0056902 A1* | 3/2018 | Trinkner | ............ | B23K 37/0294 |
| 2018/0062534 A1* | 3/2018 | Xiong | .................... | H02M 7/2176 |
| 2018/0083610 A1* | 3/2018 | Ishii | ................. | H03K 17/04123 |
| 2018/0103211 A1* | 4/2018 | Marino | ............. | H04N 21/4432 |
| 2018/0116039 A1* | 4/2018 | Harte | ...................... | G08C 17/02 |
| 2019/0281642 A1* | 9/2019 | Su | .......................... | G08C 17/02 |
| 2019/0289243 A1* | 9/2019 | Pretlow | ................. | G08C 17/02 |

\* cited by examiner

WIRELESS SWITCH WITH THREE-WAY CONTROL

BACKGROUND

With the increasing ubiquity of "smart home" devices and the Internet of Things (IoT), the desire to control devices via wireless switches is rapidly expanding. Such switches may include, for example, wall switches that control a light, an outlet, or a ceiling fan. Such switches also may include switches that are otherwise connected to a particular appliance or electronic device.

Many wireless switches can be activated by direct infrared (IR) or radio frequency (RF) controllers, or by devices that use short-range or near-field communication protocols such as Bluetooth or Bluetooth Low Energy (BLE). However, such devices and protocols require the remote controller to be very close to the switch, often with an unobstructed line-of-sight.

To address this issue, some manufacturers have begun to offer switches that are communicatively connected to one or more controllers and/or other electronic devices via a local area communications network (LAN). LANs may use communication protocols such as Wi-Fi, Z-Wave or ZigBee. When switches communicate with controllers via a LAN, their ability to be controlled necessarily depends on proper functioning of the LAN. When a LAN is down or otherwise not providing a desired level of connectivity, the ability to remotely control the switch is therefore lost.

This document describes devices and systems that are intended to address the problems described above, and/or other problems.

SUMMARY

A system for selectively delivering power to a load includes a master control unit (MCU) that includes a processing device and a receiver that is configured to be communicatively connected to a wireless network. A wireless remote control circuit is electrically connected to the MCU and comprises a remote control receiver and a switch. The remote control unit is configured to, in operation, deliver a signal of a first voltage to the MCU when the remote control receiver is not receiving a command signal from a remote controller, and deliver a signal of a second voltage to the MCU when the remote control receiver is receiving a command signal from the remote controller. A relay unit is electrically connected to a load and to an output of the MCU. The MCU is programmed to selectively power the load by selectively passing control signals to the relay unit in response to commands received from the wireless network.

When no signals are being received from the wireless network, the MCU may power the load by selectively passing control signals to the relay in response to signals received from the remote control circuit. The system also may include a reset unit that is configured to reset the MCU when the MCU is being powered up.

The system also may include further a button unit that includes a switch and that is configured to change the state of a signal to the MCU when the switch is actuated. The MCU may thus be programmed to selectively power the load by selectively passing control signals to the relay in response to signals received from the button unit when no signals are being received from the wireless network. Optionally, the MCU also may be programmed to override signals received from the wireless network in response to changes of state of a signal received from the button unit. In various embodiments, the MCU also may be programmed to selectively deliver the load by selectively passing the signals to the relay unit when the MCU detects that an AC voltage input is at a zero-crossing.

In some embodiments, the remote control circuit may include a remote control receiver and a transistor. In these embodiments, the remote control receiver is electrically connected to the base of the transistor, and the transistor is configured to provide a relatively higher voltage to the MCU when no command signal is received from the remote controller, and a relatively lower voltage to the MCU when a command signal is received from the remote controller.

In some embodiments, the system also may include an AC-to-DC power converter that is configured to convert power received from an AC source into DC power and provide the DC power to the MCU and to the control circuit. The AC-to-DC power converter may include a rectifier that is configured to receive power from the AC source and convert the AC power into DC power of a first voltage, The AC-to-DC power converter also may include a DC-to-DC converter circuit that is configured to step down the DC power from a first voltage to a second voltage that is lower than the first voltage and that corresponds to a voltage requirement of the load. The AC-to-DC power converter also may include a resistor-capacitor voltage drop circuit that includes a zener diode, the DC-to-DC converter, and a voltage drop capacitor that are electrically connected to each other in parallel.

DETAILED DESCRIPTION

Figure 1:
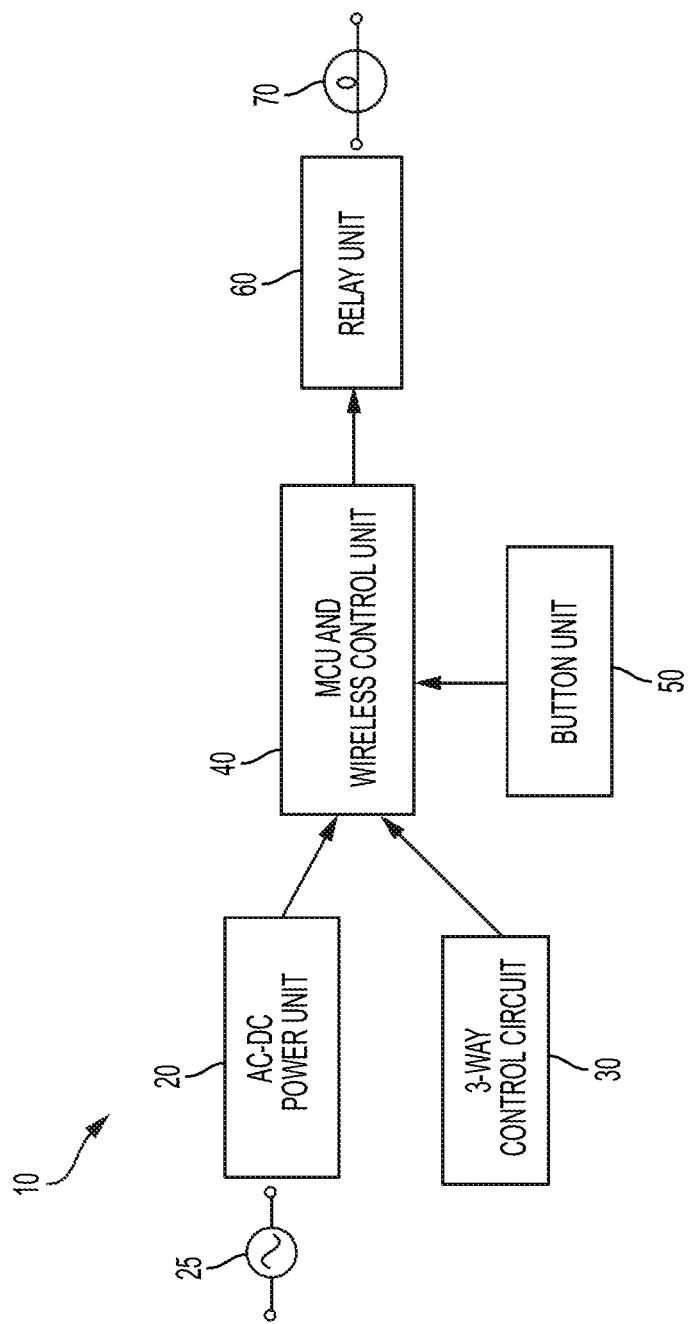
FIG. 1 is a block diagram illustrating an overall circuit structure.

Terminology that is relevant to this disclosure includes:

As used in this document, the singular forms "a," "an," and "the" include plural references unless the context clearly dictates otherwise. Unless defined otherwise, all technical and scientific terms used herein have the same meanings as commonly understood by one of ordinary skill in the art. When used in this document, the term "comprising" (or "comprises") means "including (or includes), but not limited to." When used in this document, the term "exemplary" is intended to mean "by way of example" and is not intended to indicate that a particular exemplary item is preferred or required.

In this document, when terms such "first" and "second" are used to modify a noun, such use is simply intended to distinguish one item from another, and is not intended to require a sequential order unless specifically stated. The term "approximately," when used in connection with a numeric value, is intended to include values that are close to, but not exactly, the number. For example, in some embodiments, the term "approximately" may include values that are within +/−10 percent of the value.

An "electronic device" refers to a device or system that includes a processor and memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions. Examples of electronic devices include personal computers, servers, mainframes, virtual machines, containers, gaming systems, televisions, digital home assistants and mobile electronic devices such as smartphones, fitness tracking devices, wearable virtual reality devices, Internet-connected wearables such as smart watches and smart eyewear, personal digital assistants, cameras, tablet computers, laptop computers, media players and the like. Electronic devices also may include appliances and other devices that can communicate in an Internet-of-things arrangement, such as smart thermostats, refrigerators, connected light bulbs and other devices. Electronic devices also may include components of vehicles such as dashboard entertainment and navigation systems, as well as on-board vehicle diagnostic and operation systems.

In this document, the terms "processor" and "processing device" refer to a hardware component of an electronic device that is configured to execute programming instructions. Except where specifically stated otherwise, the singular terms "processor" and "processing device" are intended to include both single-processing device embodiments and embodiments in which multiple processing devices together or collectively perform a process.

In this document, "electronic communication" refers to the transmission of data via one or more signals between two or more electronic devices, whether through a wired or wireless network, and whether directly or indirectly via one or more intermediary devices. Devices are "communicatively connected" if the devices are able to send and/or receive data via electronic communication.

The devices and systems described in this document are designed to communicate with each other and/or be remotely controlled by a wireless communications network. The network will typically have a central network controller, such as a wireless router or other electronic device that broadcasts a network ID. The central network controller will manage communications between devices on the network, either by itself or with the assistance of one or more electronic devices that include secondary network controllers. Secondary controllers may be used in a mesh network or other network topology. Secondary controllers, as well as other devices that are communicatively connected to the network, are sometimes referred to as "nodes." Examples of communication protocols that may be used in a wireless communication system include wireless TCP/IP (commonly known as WiFi), ZigBee and Z-wave.

The Z-wave communication protocol operates at a specified frequency (such as 908.42 MHz in the United States or 868.42 MHz in Europe), and it uses mesh network topology. A Z-wave network may or may not use secondary controllers, and communications may be transmitted across the network through any interconnected stationary device (each, a node), so that signals can move around communication obstacles and move beyond the range of any single stationary device on the network.

FIG. 1 is a block diagram illustrating example elements of a circuit 10 that may be components of a switch to control an electrically connected load 70, such as a light, fan, or motor that controls opening and closing of a window covering. The elements include an AC-to-DC power unit 20, which serves the function of converting alternating current (AC) received from an AC source 25 to direct current (DC). The elements also include a button unit 50 that includes a tactile switch that may be physically operated to selectively connect and disconnect the circuit path between the AC-to-DC power unit 20 and the load 70. The circuit 10 also includes a device that this document refers to as a three-way control circuit 30, which serves to receive remote control signals that can be used to operate a master control unit (MCU) 40. The MCU and wireless remote control unit 40 is a circuit that includes elements that, when actuated, will control a relay unit 60 and selectively deliver power to the load 70. The MCU and wireless remote control unit 40 includes a processor and is communicatively and/or electrically connected to the three-way control circuit 30 so that the three-way control circuit 30 actuates the MCU. The wireless controller of the MCU and wireless remote control unit 40 includes a processor and an antenna that is configured to connect to a LAN and receive signals from a remote, wireless controller that is also communicatively connected to the LAN. The wireless controller will communicate with the remote controller using a wireless communication protocol such as WiFi, ZigBee or Z-wave. Optionally, a button unit 50 also may be electronically connected to the MCU and wireless control unit 40 for generating direct control signals via a touch-sensitive user interface.

Figure 2:
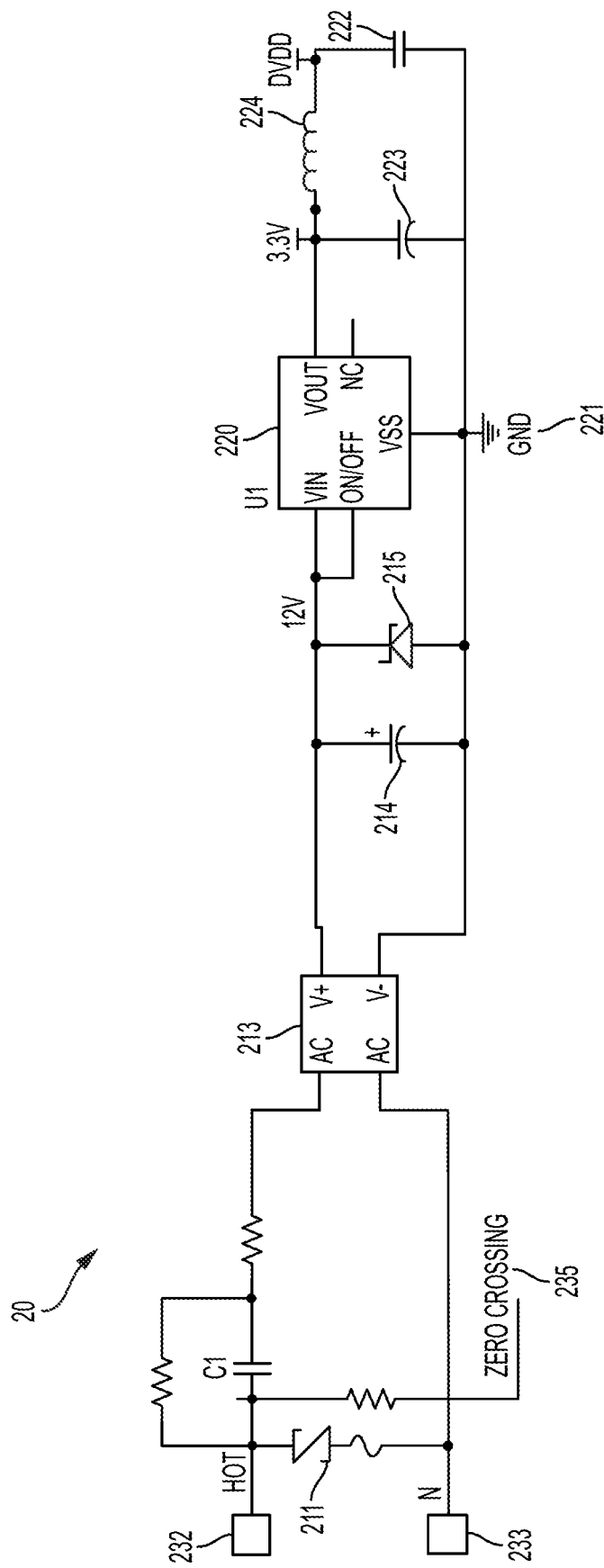
FIG. 2 is a circuit diagram of an example AC-DC power converter.

FIG. 2 is a circuit diagram of an example AC-to-DC power unit 20. The AC-to-DC power unit 20 includes an AC-to-DC converter circuit 201 that is configured to convert AC power from the AC source (25 in FIG. 1) into DC. In the example shown, the AC-to-DC converter circuit 201 includes a thermally protected metal oxide varistor (MOV) 211 positioned in parallel between the hot and neutral source terminals (232 and 233, respectively) to provide transient voltage suppression and help prevent circuit damage from transient overvoltage conditions. A positive voltage is applied to a rectifier 213, which in this example is a full-wave rectifier bridge that includes four or more diodes in a bridge circuit configuration for converting the AC input into a DC output. Other AC-to-DC converter circuits may be used, such as that disclosed in U.S. patent application publication number 2018/0062534, published Mar. 1, 2018 naming Xiong and Zhong as inventors, the disclosure of which is incorporated into this document by reference.

A capacitor 214 and zener diode 215 are connected in parallel across the output terminals of the rectifier 213 to help regulate the rectifier's output voltage before it reaches a DC-to-DC converter 220. The DC-to-DC converter 220 is electrically connected between the positive output terminal of the rectifier 213 and ground 221 to step down the DC voltage to a voltage that is appropriate for the load. For example, the zener diode 215 may have a breakdown voltage of about 12V, in which case the DC-to-DC converter 220 may step down the DC voltage from an input of about 12V to an output of about 3.3V which would be appropriate for a circuit that may control a light, fan or similar device. Other voltages may be employed in various embodiments depending on the nature of the load.

The DC-to-DC converter 220 forms part of a resistor-capacitor voltage drop circuit that includes zener diode 215, the DC-to-DC converter 220 and a non-polarized voltage drop capacitor 222, each electrically connected in parallel. The circuit also may include a polarized capacitor 223 and inductor 224, which provide the function of a low-pass filter.

The DC output of the AC-to-DC power unit 20 will be electrically connected to the MCU and wireless control unit (40 in FIG. 1), which will be described in more detail below. In addition, the zero-crossing 225 may send an AC voltage signal to the MCU to provide the a signal for relay control as illustrated below in FIG. 4 and as will be described in the context of FIG. 6.

Figure 3:
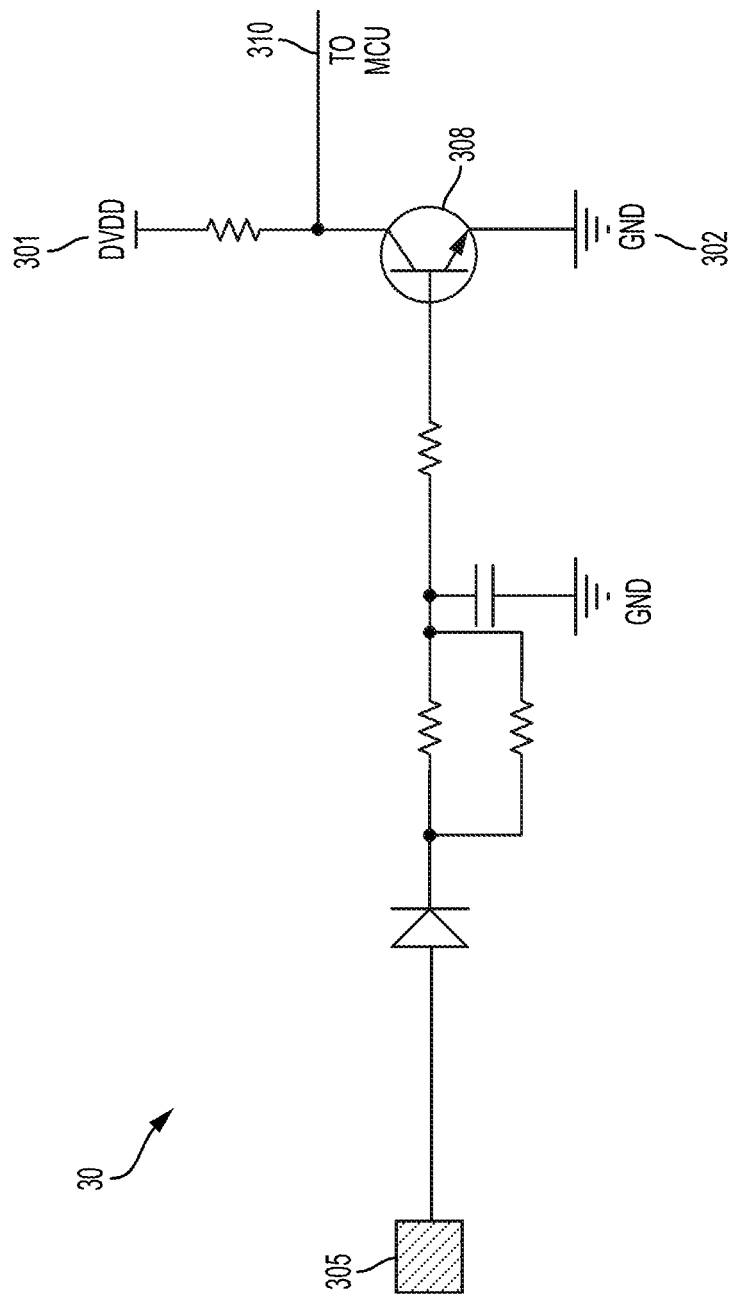
FIG. 3 is a circuit diagram of an example three-way control circuit.

FIG. 3 is a circuit diagram of an example three-way control circuit 30. The three-way control circuit 30 serves as a remote control circuit and receives DC power via an input 301 that is electrically connected to the output AC-to-DC power unit 20. The three-way control circuit 30 also includes a remote control port 305 that may receive wireless signals from a remote controller electronic device when a wireless network is not available to deliver commands to the MCU and wireless control unit. The remote control port 305 is electrically connected to the base of a transistor whose collector is electrically connected to the DC input 301 and whose emitter is electrically connected to ground 302. When the remote control port 305 is floating (that is, receiving no command signal from the remote controller), the transistor 308 will operate to provide a signal of a first voltage (such as a relatively higher voltage of 3.3V) to the output 310 to the MCU. When the remote control port 305 is receiving a command signal from the remote controller, the transistor 308 will switch from a hot connection to a neutral connection and operate to provide a signal of a second voltage (such as a relatively lower voltage, at or near zero) through the output 310 to the MCU. The MCU can use the output signal to determine whether to operate based on commands from the remote controller or from the wireless network.

Figure 4:
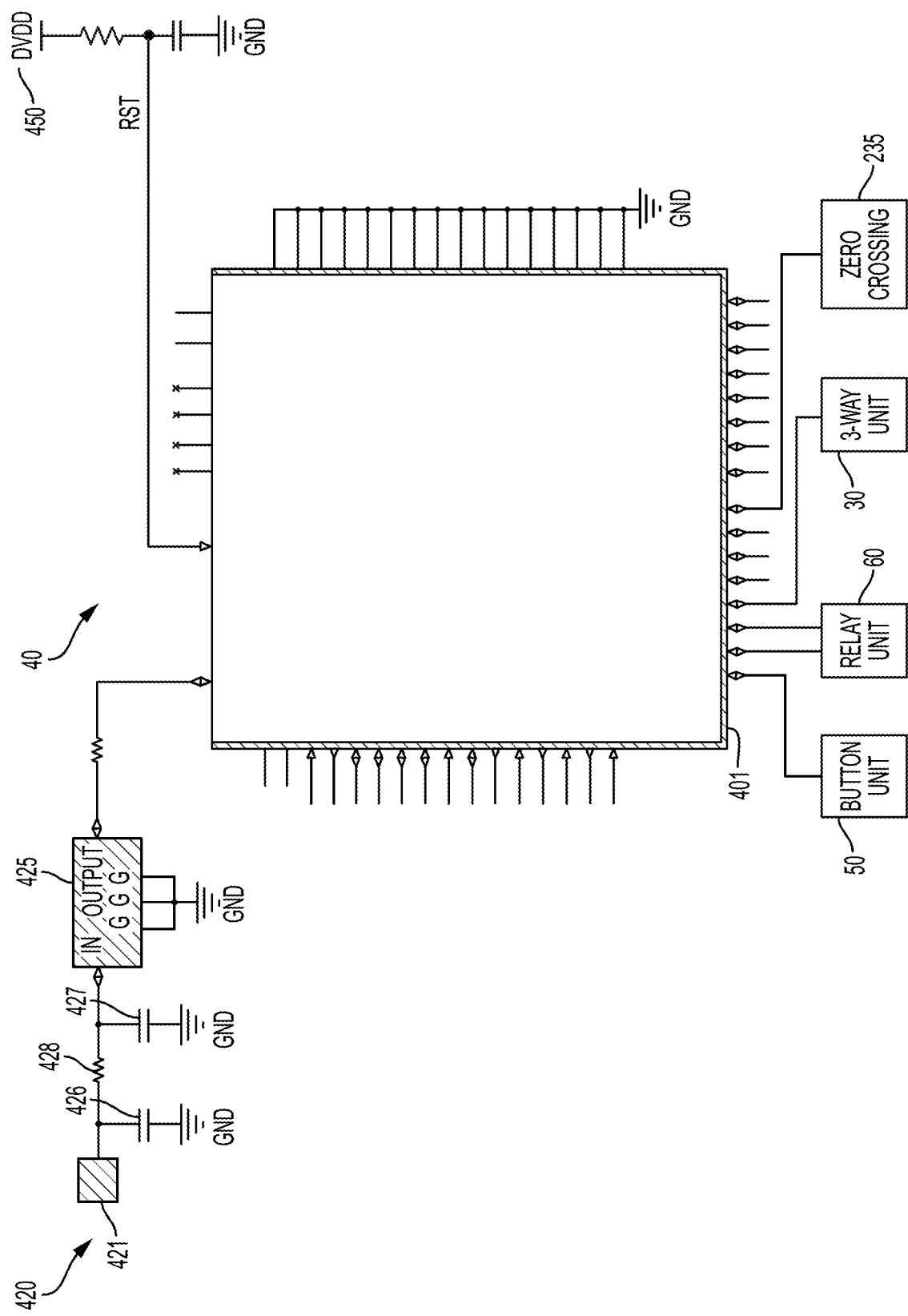
FIG. 4 is a circuit diagram of an example master control unit and wireless control unit.

FIG. 4 is a circuit diagram of an example MCU and wireless control unit 40 and examples of how it may interconnect with other elements of the system. In this embodiment, MCU and wireless control unit 40 includes an integrated circuit 401 that functions as a processing device that may receive, interpret and selectively signals from the outputs of the three-way unit 30, a button unit 50 (described in more detail below), the zero crossing 235 of the AC-to-DC power unit, and a wireless LAN via a wireless LAN receiver circuit 420 that includes a receiver that is configured to be communicatively connected to a wireless network. The MCU and wireless control unit 40 is also electrically connected to the relay unit 60 and is configured to generate and deliver control signals to the relay unit based on signals that the MCU and wireless control unit 40 receives from the three-way unit 30, button unit 50, and/or wireless LAN receiver circuit 420. An example integrated circuit may be a Sigma Designs, Inc. ZM510A-CME3R RF transceiver IC, although other integrated circuits may be used.

The wireless LAN receiver circuit 420 includes an antenna 421 and a surface acoustic wave (SAW) filter 425 that are configured to receive control signals from the wireless LAN and direct the control signals to the MCU and wireless control unit 40. Capacitors 426 and 427 may be connected in parallel across a resistor 428 to reduce signal attenuation. The LAN receiver circuit 420 may be a Z-wave receiver, ZigBee receiver, or a receiver that is configured to operate on a different communication protocol. The MCU and wireless control unit 40 also may be electrically connected to a reset circuit 450 that, when activated, will reset the MCU and wireless control unit 40 to a baseline condition. In additional or alternatively, the reset circuit 450 may actuate when the MCU is powered up. [

Figure 5:
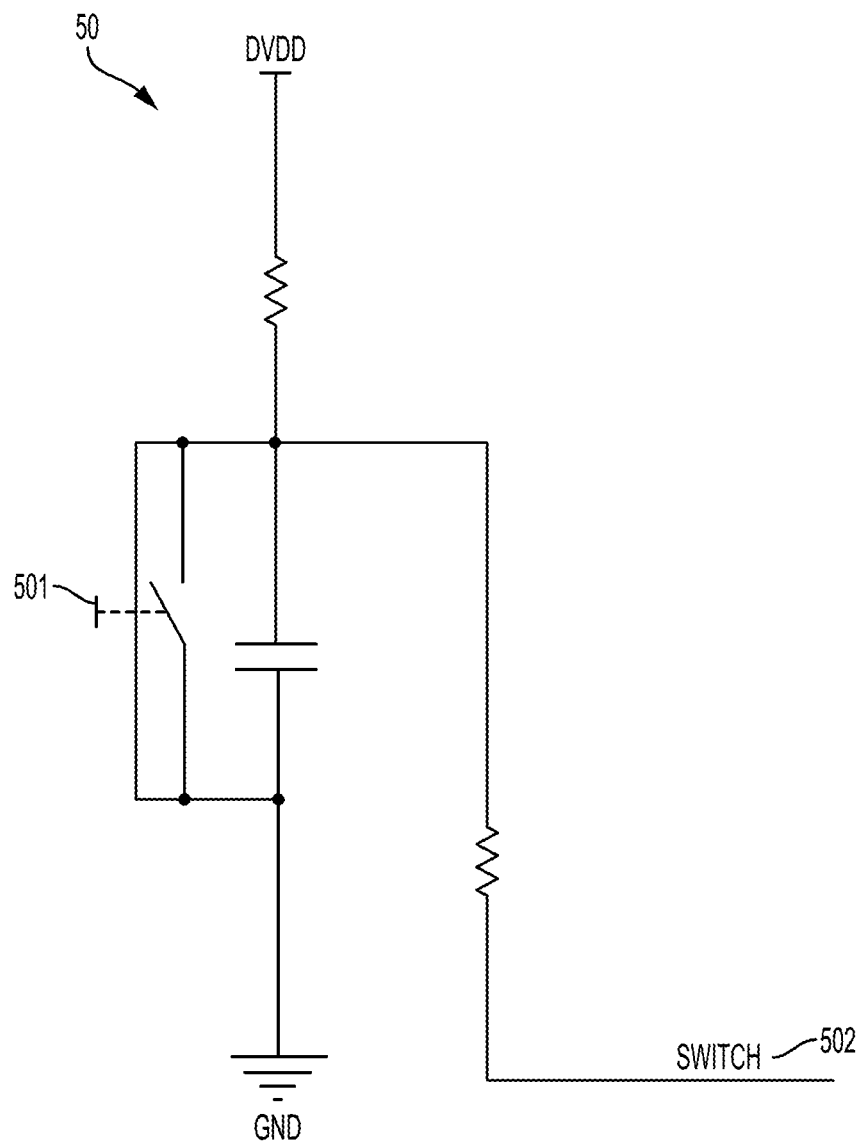
FIG. 5 is a circuit diagram of an example button unit.

FIG. 5 is a circuit diagram of an example button unit 50. The button unit 50 will include a physical switch 501 that, when actuated to connect an input voltage to ground, will generate an output signal 502 that will be passed to an input of the MCU and wireless control unit 40. When the MCU and wireless control unit 40 receives the signal, it may actuate or deactuate one or more connected loads in response to a change of state of the signal. For example, the circuit of FIG. 5 shows a normally off switch, and a voltage is passed to the MCU when the switch is actuated. However, a normally on switch may be used in some embodiments, and the change of state from voltage to no voltage may be used by the MCU as an indication that the switch has been actuated. Optionally, multiple switches may be provided, each of which is connected to a different input of the MCU and wireless control unit 40 so that the MCU and wireless control unit 40 may selectively actuate and/or deactivate two or more loads depending on the input terminal that receive the signal.

Figure 6:
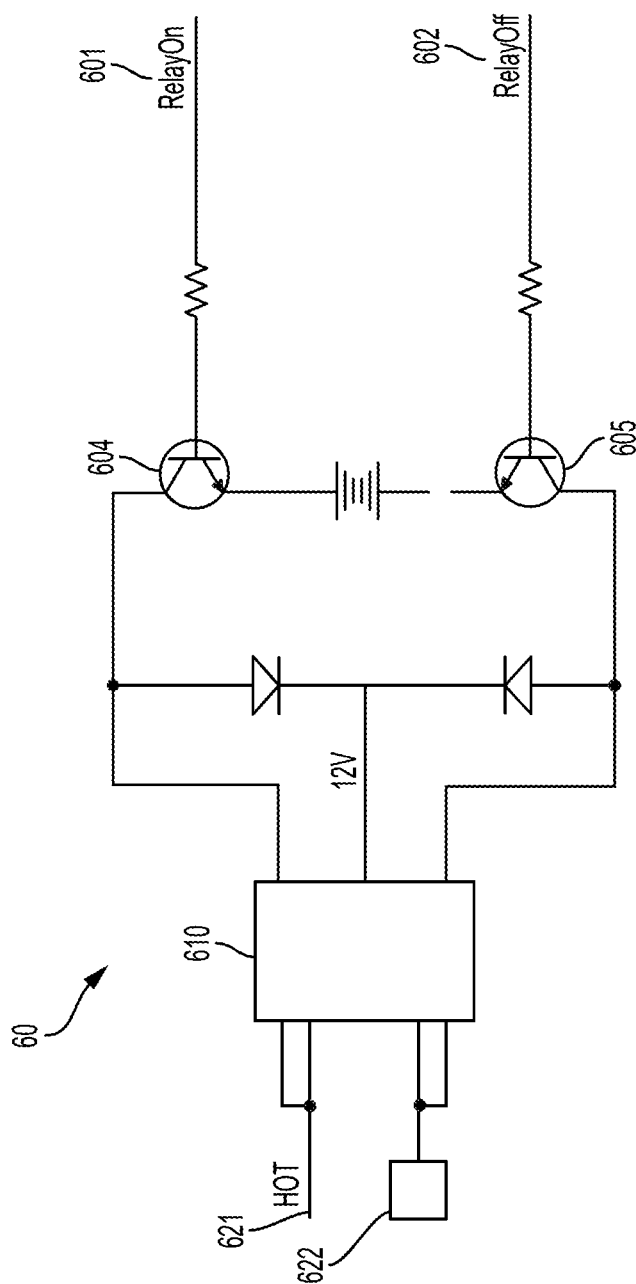
FIG. 6 is an example circuit diagram for a relay unit

FIG. 6 is an example circuit diagram for a relay unit 60. The relay unit 60 includes a relay 610 that selectively delivers power to a connected load. The relay unit 60 will include an Relay On signal line 601 and a Relay Off signal line 602 that are electrically connected to their corresponding output pins of the MCU and wireless control unit (40 in FIG. 4). The signals received via these signal lines are passed through triodes 604, 605 to a relay 610 that turns the load on or off by selectively sending a voltage across output terminals 621, 622.

Figure 7:
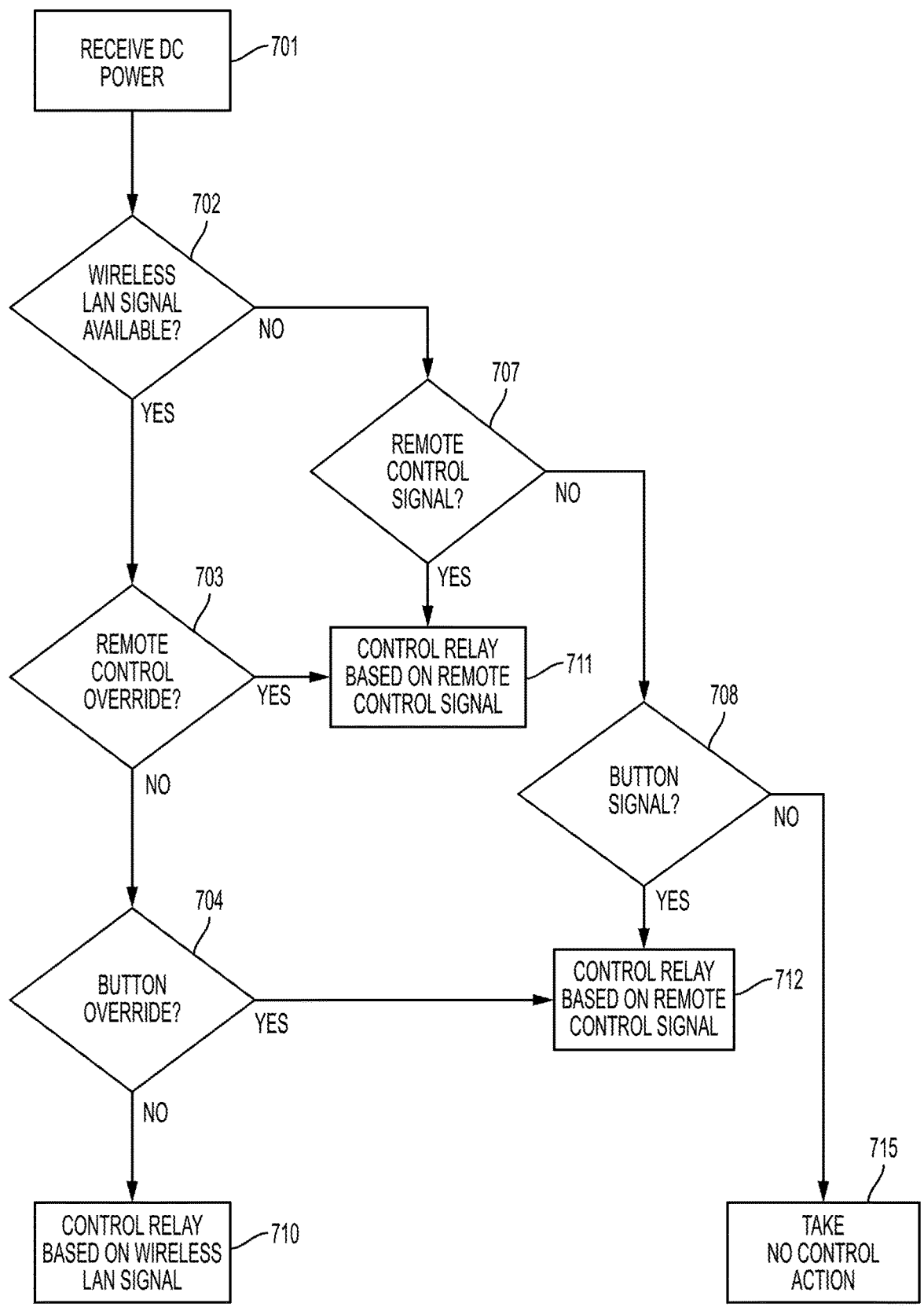
FIG. 7 is an example process flow that the master control unit may implement.

FIG. 7 is an example process flow that the MCU and wireless control unit may implement, via programming instructions available through software and/or firmware. The control unit and other components of the system will receive power from the source (step 701), optionally via an AC-to-DC converter unit. When the control unit receives a command signal, it may determine whether the command signal is received from a wireless LAN, or from a remote control unit. Because the wireless LAN, remote control unit and zero-crossing each have separate inputs to the control unit, the control unit will determine which type of signal is received, and it will know which type of signal is received based on the input via which the control unit receives the signal. If a wireless LAN signal is available (step 702), the control unit may control the relay based on the signal received from the wireless LAN (step 710). If a wireless LAN signal is not available (step 702), the system may determine whether a remote control signal from a remote control unit has been received (step 707) and/or whether a command signal from a button unit has been received (step 708). If a remote control signal from a remote control unit has been received (step 707), the control unit may control the relay based on the signal received from the remote control unit (step 711). Optionally, even if a wireless LAN signal is available, the system may control the relay based on the signal received from the remote control unit if the control unit also receives an override command signal from the remote control unit (step 703).

If a command signal from a button unit has been received (step 708), the control unit may control the relay based on the signal received from the remote control unit (step 712). In each of these cases, the MCU may actuate the relay when the zero-crossing signal (235 in FIG. 2) indicates that the AC voltage is at a zero crossing. If no signals have been received from any of the available units, the control unit may take no control action (step 715). The hierarchy shown in FIG. 7, which shows the order of precedence if multiple signals are received as being (1) commands from the remote control unit, (2) commands from the button unit, and (3) commands from the wireless LAN, is by way of example only. Other orders of hierarchy may be used, such as an order in which the wireless LAN signals and/or the button unit signals take precedence over commands from the remote control unit.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A system for selectively delivering power to a load, the system comprising:
   a master control unit (MCU) comprising a processing device and a receiver that is configured to be communicatively connected to a wireless network;
   a remote control circuit that is electrically connected to the MCU, comprises a remote control receiver and a switch, and is configured to, in operation:
      deliver a signal of a first voltage to the MCU when the remote control receiver is not receiving a command signal from a remote controller, and
      deliver a signal of a second voltage to the MCU when the remote control receiver is receiving a command signal from the remote controller; and
   a relay unit that is electrically connected to a load and to an output of the MCU;
   wherein the MCU is programmed to selectively power the load by selectively passing control signals to the relay unit in response to commands received from the wireless network.

2. The system of claim 1, wherein the MCU is programmed to selectively power the load by selectively passing control signals to the relay unit in response to signals received from the remote control circuit when no signals are being received from the wireless network.

3. The system of claim 1, further comprising a reset unit configured to reset the MCU when the MCU is being powered up.

4. The system of claim 1, wherein the MCU is programmed to override signals received from the wireless network and selectively power the load by selectively passing control signals to the relay unit in response to signals received from the remote control circuit.

5. The system of claim 1:
   further comprising a button unit that includes a switch and that is configured to change a state of a signal to the MCU when the switch of the button unit is actuated; and
   wherein the MCU is programmed to selectively power the load by selectively passing control signals to the relay unit in response to signals received from the button unit when no signals are being received from the wireless network.

6. The system of claim 1:
   further comprising a button unit that includes a switch and that is configured to change a state of a signal to the MCU when the switch of the button unit is actuated; and
   wherein the MCU is programmed to override signals received from the wireless network and selectively power the load by selectively passing control signals to the relay unit in response to signals received from the button unit.

7. The system of claim 1, wherein:
   the remote control circuit also comprises a transistor;
   the remote control receiver is electrically connected to a base of the transistor; and
   the transistor is configured to provide a relatively higher voltage to the MCU when no command signal is received from the remote controller and a relatively lower voltage to the MCU when a command signal is received from the remote controller.

8. The system of claim 1, further comprising an AC-to-DC power converter that is configured to convert power received from an AC source into DC power and provide the DC power to the MCU and to the control circuit.

9. The system of claim 8, wherein the AC-to-DC power converter comprises:
   a rectifier that is configured to receive AC power from the AC source and convert the AC power into DC power of a first voltage; and
   a DC-to-DC converter that is configured to step down the DC power from a first voltage to a second voltage that is lower than the first voltage and that corresponds to a voltage requirement of the load.

10. The system of claim 9, wherein the AC-to-DC power converter further comprises a resistor-capacitor voltage drop circuit that includes a zener diode, the DC-to-DC converter, and a voltage drop capacitor that are electrically connected to each other in parallel.

11. The system of claim 1, wherein the MCU is also programmed to selectively deliver the load by selectively passing the signals to the relay unit when the MCU detects that an AC voltage input is at a zero-crossing.

12. A method of selectively delivering power to a load, the method comprising:
   by a master control unit (MCU) comprising a processing device and a receiver that is configured to be communicatively connected to a wireless network:
      receiving a command signal,
      determining whether the command signal is received from a wireless local area network (LAN) or a remote wireless control unit,
      if the command signal is received from the wireless LAN, sending a signal to a relay unit to selectively power the load in response to signals received from the wireless LAN, and
      if the command signal is not received from the wireless LAN, sending a signal to a relay unit to selectively power the load in response to signals received from the remote wireless control unit.

13. The method of claim 12 further comprising, by the relay unit, selectively powering the load in response to signals received from the remote wireless control unit.

14. The method of claim 12 further comprising, by the MCU before receiving the command signal:
   receiving a power up command; and
   executing a reset function when powering up in response to the power up command.

15. The method of claim 12, further comprising, by the MCU:
   receiving an override signal from the wireless remote control unit; and
   sending a signal to the relay unit to selectively power the load in response to signals received from the remote wireless control unit in response to the override signal.

16. The method of claim 12, wherein:
   determining whether the command signal is received from the wireless LAN or the remote wireless control unit also comprises determining whether the command signal is received from a button unit that includes a switch and that is configured to change a state of a signal to the MCU when the switch of the button unit is actuated; and the method further comprises, if the command signal is received from the button unit and not from the wireless LAN or the remote wireless control unit, sending a signal to the relay unit to selectively power the load in response to signals received from the button unit.

17. The method of claim 12, wherein determining whether the command signal is received from the wireless LAN or the remote wireless control unit also comprises determining whether the command signal is received from a button unit that includes a switch and that is configured to change a state of a signal to the MCU when the switch of the button unit is actuated; and the method further comprises, if the command signal is received from the button unit, sending a signal to a relay unit to selectively power the load in response to signals received from the button unit and overriding any signal received from the wireless LAN and/or the remote wireless control unit.

18. The method of claim 12 further comprising, by an AC-to-DC power converter, converting power received from an AC source into DC power and providing the DC power to the MCU and to the wireless remote control unit.

19. The method of claim 12 further comprising, by the MCU when sending signals to the relay unit, doing so when the MCU detects that an AC voltage input is at a zero-crossing.

20. A system for selectively delivering power to a load, the system comprising:

a master control unit (MCU) comprising a processing device and a receiver that is configured to be communicatively connected to a wireless network;

a relay unit that is electrically connected to a load and to an output of the MCU; and a remote control circuit that is electrically connected to the MCU, comprises a remote control receiver and a switch, and is configured to, in operation:

deliver a signal of a first voltage to the MCU when the remote control receiver is not receiving a command signal from a remote controller, and deliver a signal of a second voltage to the MCU when the remote control receiver is receiving a command signal from the remote controller;

wherein the MCU is programmed to selectively power the load by, when the MCU detects that an AC voltage input is at a voltage zero-crossing:

passing control signals to the relay unit in response to commands received from the wireless network selectively power the load by selectively passing control signals to the relay unit in response to signals received from the remote control circuit when signals are being received from the wireless network; and passing control signals to the relay unit in response to signals received from the remote control circuit when no signals are being received from the wireless network.

* * * * *